United States Patent
Harris

(10) Patent No.: US 8,057,110 B2
(45) Date of Patent: Nov. 15, 2011

(54) CARD GUIDE AND HEATSINK ASSEMBLIES FOR PLUGGABLE ELECTRO-OPTIC MODULES

(75) Inventor: David Bennitt Harris, Columbia, MD (US)

(73) Assignee: Ciena Corporation, Linthicum, MD (US)

( * ) Notice: Subject to any disclaimer, the term of this patent is extended or adjusted under 35 U.S.C. 154(b) by 0 days.

(21) Appl. No.: 12/838,592

(22) Filed: Jul. 19, 2010

(65) Prior Publication Data
US 2010/0284152 A1 Nov. 11, 2010

Related U.S. Application Data

(62) Division of application No. 12/061,099, filed on Apr. 2, 2008, now Pat. No. 7,780,361.

(51) Int. Cl.
*G02B 6/36* (2006.01)
*H01R 13/648* (2006.01)
*H05K 1/11* (2006.01)

(52) U.S. Cl. ........... 385/92; 385/88; 385/89; 385/94; 439/485; 439/487; 439/607.2; 439/607.21; 361/697; 361/741; 361/756; 361/801; 361/802

(58) Field of Classification Search ............. 385/92; 361/679.47, 679, 54, 697, 702, 703, 707, 361/709, 710; 439/487
See application file for complete search history.

(56) References Cited

U.S. PATENT DOCUMENTS

| | | | |
|---|---|---|---|
| 6,478,622 B1 | 11/2002 | Hwang | |
| 6,524,134 B2 | 2/2003 | Flickinger et al. | |
| 6,793,517 B2 * | 9/2004 | Neer et al. | 439/372 |
| 6,817,886 B2 * | 11/2004 | Amorim | 439/377 |
| 6,875,056 B1 * | 4/2005 | Bianchini et al. | 439/607.2 |
| 6,916,122 B2 * | 7/2005 | Branch et al. | 385/92 |
| 6,935,882 B2 * | 8/2005 | Hanley et al. | 439/372 |
| 6,986,679 B1 * | 1/2006 | Aronson et al. | 439/374 |
| 6,992,895 B2 * | 1/2006 | Lindberg | 361/719 |
| 7,003,230 B2 * | 2/2006 | Branch et al. | 398/135 |
| 7,090,519 B2 * | 8/2006 | Muramatsu et al. | 439/159 |
| 7,195,403 B2 * | 3/2007 | Oki et al. | 385/92 |
| 7,224,582 B1 * | 5/2007 | Saturley et al. | 361/679.54 |
| 7,433,193 B2 * | 10/2008 | Yee et al. | 361/715 |
| 7,539,018 B2 * | 5/2009 | Murr et al. | 361/704 |
| 2002/0131122 A1 * | 9/2002 | Anderl et al. | 359/152 |
| 2002/0131730 A1 * | 9/2002 | Keeble et al. | 385/92 |
| 2003/0161108 A1 * | 8/2003 | Bright et al. | 361/707 |
| 2003/0169567 A1 * | 9/2003 | Tantoush et al. | 361/695 |
| 2003/0171013 A1 * | 9/2003 | Keeble et al. | 439/79 |
| 2004/0027816 A1 * | 2/2004 | Ice | 361/797 |
| 2004/0085744 A1 * | 5/2004 | Leeson et al. | 361/816 |
| 2004/0226689 A1 * | 11/2004 | Thompson et al. | 165/80.2 |
| 2005/0100292 A1 * | 5/2005 | Malagrino, Jr. | 385/92 |
| 2005/0190540 A1 * | 9/2005 | Shearman et al. | 361/715 |
| 2005/0195565 A1 * | 9/2005 | Bright | 361/688 |
| 2005/0195571 A1 * | 9/2005 | Bulman-Fleming et al. | 361/704 |
| 2006/0281357 A1 * | 12/2006 | Chen et al. | 439/350 |

* cited by examiner

*Primary Examiner* — Ryan Lepisto
(74) *Attorney, Agent, or Firm* — Clements Bernard PLLC; Christopher L. Bernard; Lawrence A. Baratta, Jr.

(57) ABSTRACT

In various exemplary embodiments, the present invention provides improved card guide and heatsink assemblies for pluggable electro-optic modules utilized in optical communications networks and the like. More specifically, the present invention provides a solderable surface-mounted card guide assembly and a staggered heatsink assembly. These assemblies are utilized with small-form factor pluggable electro-optic modules and the like, and the concepts presented herein can be extended to XFP, XENPAK, XPAK, and X2 electro-optic modules, for example. The solderable surface-mounted card guide assembly of the present invention finds particular applicability with small-form factor pluggable electro-optic modules not utilizing any type of module cage, while the staggered heatsink assembly of the present invention finds particular applicability with small-form factor pluggable electro-optic modules both not utilizing and utilizing any type of module cage.

11 Claims, 5 Drawing Sheets

CARD GUIDE AND HEATSINK ASSEMBLIES FOR PLUGGABLE ELECTRO-OPTIC MODULES

CROSS-REFERENCE TO RELATED APPLICATION(S)

This application is a divisional of U.S. patent application Ser. No. 12/061,099 filed Apr. 2, 2008 now U.S. Pat. No. 7,780,361 and entitled "CARD GUIDE AND HEATSINK ASSEMBLIES FOR PLUGGABLE ELECTRO-OPTIC MODULES", the disclosure of which is incorporated by reference herein.

FIELD OF THE INVENTION

The present invention relates generally to card guide and heatsink assemblies for pluggable electro-optic modules utilized in optical communications networks and the like. More specifically, the present invention relates to a solderable surface-mounted card guide assembly and a staggered heatsink assembly. These assemblies are utilized with small-form factor pluggable electro-optic modules and the like. The solderable surface-mounted card guide assembly finds particular applicability with small-form factor pluggable electro-optic modules not utilizing any type of module cage, while the staggered heatsink assembly finds particular applicability with small-form factor pluggable electro-optic modules both not utilizing and utilizing any type of module cage.

BACKGROUND OF THE INVENTION

With respect to optical communications components and the like, conventional card guide assemblies are primarily designed for circuit pack guidance into a shelf or chassis. These card guide assemblies are not readily applicable at the circuit pack level, where guidance for pluggable electro-optic modules, such as small-form factor pluggable electro-optic modules, is required. For example, the card guide assemblies are typically designed to mount through the board when utilized at the circuit pack level and require some sort of mounting bracket, such as a fastener or clip, for this reason. As a result, the card guide assemblies are board thickness-dependent. The holes created in the board increase the routing complexity of the board by blocking circuit signal routing channels in the board and negatively impact the availability of the bottom of the board for the placement of components.

The current state-of-the-art for cooling most pluggable electro-optic modules involves mounting heatsinks directly to the components requiring cooling using various mounting brackets and/or adhesives. Most industry-standard XFP type electro-optic modules that plug into a cage assembly are cooled using clip-on heatsinks or the like, and do not use card guide assemblies. The interface is a sliding dry contact interface and the heatsinks cool the components through the convection cooling of the entire circuit pack when it is plugged into the electronic shelf of the system. The current state-of-the-art is limited in its ability to transfer all of the heat present when the circuit pack is plugged into the electronic shelf of the system, however, because, when multiple pluggable electro-optic modules are plugged into the circuit pack, the heatsinks that are located downstream of the incoming air flow are blocked and starved of air flow from the heatsinks that are located upstream. This negatively limits the number of pluggable electro-optic modules that can be plugged into the circuit pack. This is true for both cage-less and cage-mounted XFP type electro-optic modules.

BRIEF SUMMARY OF THE INVENTION

In various exemplary embodiments, the present invention provides improved card guide and heatsink assemblies for pluggable electro-optic modules utilized in optical communications networks and the like. More specifically, the present invention provides a solderable surface-mounted card guide assembly and a staggered heatsink assembly. These assemblies are utilized with small-form factor pluggable electro-optic modules and the like, and the concepts presented herein can be extended to XFP, XENPAK, XPAK, and X2 electro-optic modules, for example. The solderable surface-mounted card guide assembly of the present invention finds particular applicability with small-form factor pluggable electro-optic modules not utilizing any type of module cage, while the staggered heatsink assembly of the present invention finds particular applicability with small-form factor pluggable electro-optic modules both not utilizing and utilizing any type of module cage.

In one exemplary embodiment, the present invention provides a solderable surface-mounted card guide assembly configured to receive and ensure the connectivity of a pluggable electro-optic module into an optical communications component including a board, the solderable surface-mounted card guide assembly including: a plurality of card guides, wherein each of the plurality of card guides includes an internally-slotted rail that is configured to slidingly receive a guide manufactured into a side of the pluggable electro-optic module; one or more tooling pins disposed on a bottom surface of each of the plurality of card guides and configured to selectively engage a corresponding hole manufactured or drilled into the board of the optical communications component; and one or more solderable mounting tabs disposed along a length of each of the plurality of card guides and configured to be selectively soldered to a surface of the board of the optical communications component. Optionally, the plurality of card guides are each injection-molded. Optionally, the plurality of card guides are separately formed. Alternatively, the plurality of card guides are integrally formed, and the plurality of card guides are joined by one of a bottom piece and a top piece. Optionally, the one or more solderable mounting tabs are disposed along one side of the length of each of the plurality of card guides. Alternatively, the one or more solderable mounting tabs are disposed along both sides of the length of each of the plurality of card guides. Preferably, the solderable surface-mounted card guide assembly is operable for permanently and precisely receiving and ensuring the connectivity of the pluggable electro-optic module into the optical communications component comprising the board in X, Y, and Z planes.

In another exemplary embodiment, the present invention provides a method for receiving and ensuring the connectivity of a pluggable electro-optic module into an optical communications component including a board, the method including: providing a plurality of card guides, wherein each of the plurality of card guides includes an internally-slotted rail that is configured to slidingly receive a guide manufactured into a side of the pluggable electro-optic module; providing one or more tooling pins disposed on a bottom surface of each of the plurality of card guides and configured to selectively engage a corresponding hole manufactured or drilled into the board of the optical communications component; and providing one or more solderable mounting tabs disposed along a length of each of the plurality of card guides and configured to be selectively soldered to a surface of the board of the optical communications component.

In a further exemplary embodiment, the present invention provides a staggered heatsink assembly configured to control the temperature of a pluggable electro-optic module disposed in an optical communications component including a board, the staggered heatsink assembly including: one or more heatsink devices, each of the one or more heatsink devices including: one or more heatsink device mounting brackets optionally coupled to a surface of the board of the optical communications component; a heatsink plate coupled to the one or more heatsink device mounting brackets, wherein the heatsink plate is in thermal communication with the associated pluggable electro-optic module disposed in the optical communications component; and a radiative fin structure coupled to the heatsink plate opposite the associated pluggable electro-optic module disposed in the optical communications component, wherein the radiative fin structure is in thermal communication with the heatsink plate and is exposed to an air flow. Preferably, the staggered heatsink assembly also includes a heat spreader coupled to the associated pluggable electro-optic module, wherein the heat spreader is in thermal communication with both the heatsink plate of a given heatsink device and the associated pluggable electro-optic module. Alternatively, the staggered heatsink assembly includes a heat spreader coupled to the associated pluggable electro-optic module, wherein the heat spreader is in thermal communication with both the heatsink plate of a given heatsink device and the associated pluggable electro-optic module via a sliding interface. Alternatively, the staggered heatsink assembly includes a heat spreader coupled to the associated pluggable electro-optic module, wherein the heat spreader is in thermal communication with both the heatsink plate of a given heatsink device and the associated pluggable electro-optic module via a sliding spring-loaded interface. Optionally, at least two of the one or more heatsink devices include a radiative fin structure of a different height. Optionally, at least two of the one or more heatsink devices include a radiative fin structure that is disposed in a different location relative to a front plate of the optical communications component. In an exemplary embodiment of the present invention, the optical communications component is a circuit pack.

In a still further exemplary embodiment, the present invention provides a method for controlling the temperature of a pluggable electro-optic module disposed in an optical communications component including a board, the method including: providing one or more heatsink devices, providing each of the one or more heatsink devices including: providing one or more heatsink device mounting brackets optionally coupled to a surface of the board of the optical communications component; providing a heatsink plate coupled to the one or more heatsink device mounting brackets, wherein the heatsink plate is in thermal communication with the associated pluggable electro-optic module disposed in the optical communications component; and providing a radiative fin structure coupled to the heatsink plate opposite the associated pluggable electro-optic module disposed in the optical communications component, wherein the radiative fin structure is in thermal communication with the heatsink plate and is exposed to an air flow.

BRIEF DESCRIPTION OF THE DRAWINGS

The present invention is illustrated and described herein with reference to the various drawings, in which like reference numbers are used to denote like system components/method steps, as appropriate, and in which.

DETAILED DESCRIPTION OF THE INVENTION

Figure 1:
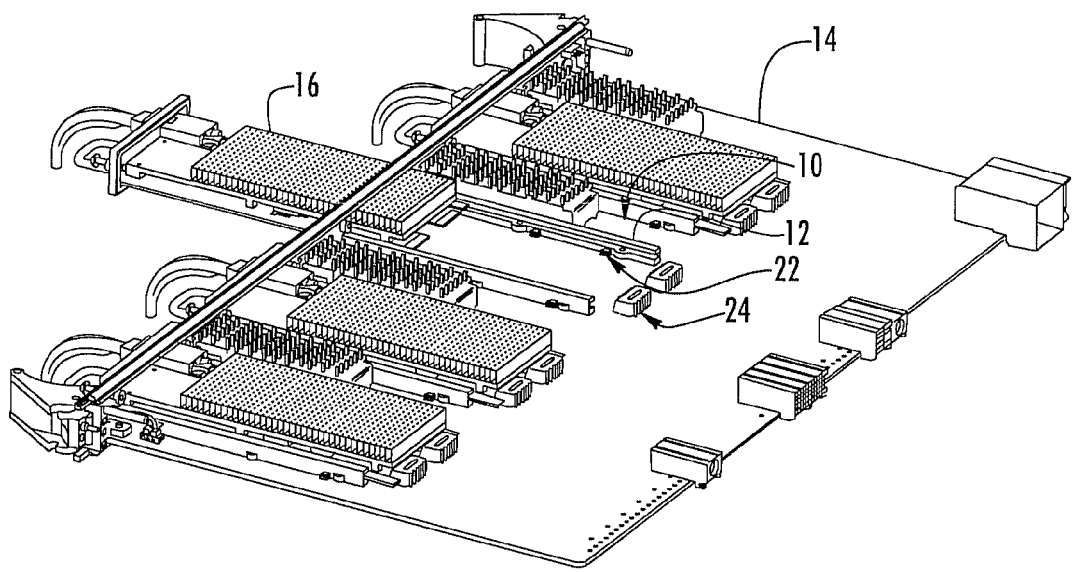
FIG. 1 is a perspective view of one exemplary embodiment of the solderable surface-mounted card guide assembly of the present invention.
Figure 2:
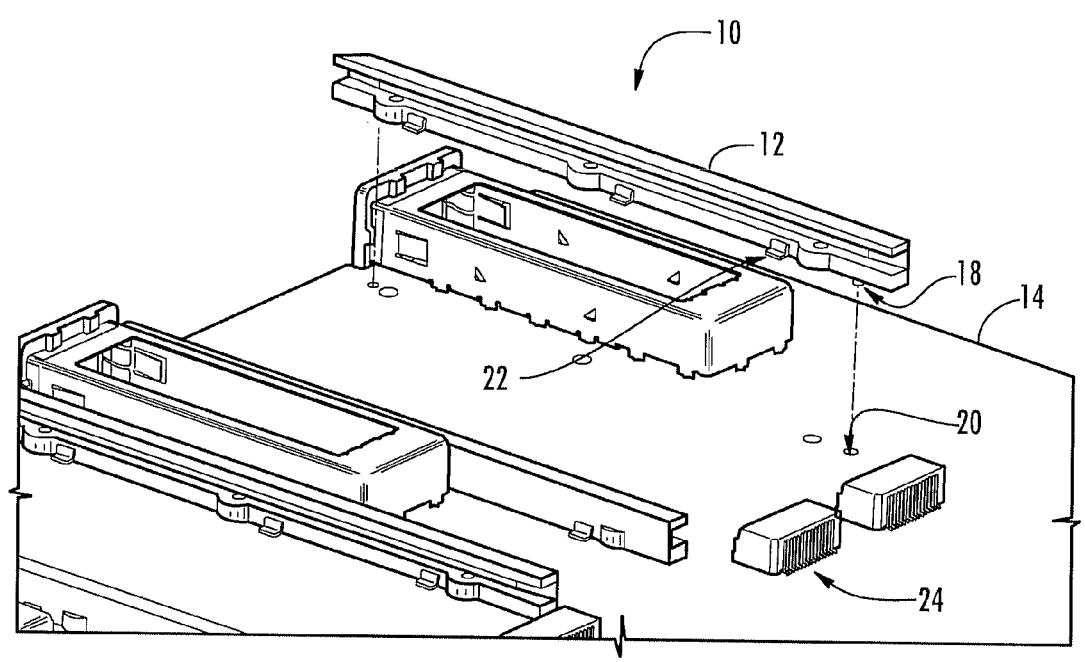
FIG. 2 is an exploded partial perspective view of the solderable surface-mounted card guide assembly of FIG. 1, highlighting the configuration of one of the associated card guides.

Referring to FIGS. 1 and 2, the solderable surface-mounted card guide assembly 10 of the present invention includes a plurality of injection-molded card guides 12 that are selectively affixed to the board 14 (such as the PWB) of an optical communications component (not illustrated). The plurality of injection-molded card guides 12 include a plurality of internally-slotted rails or the like that are selectively affixed to the board 14 of the optical communications component such that they are configured to slidingly receive guides (not illustrated) manufactured into either side of a small-form factor pluggable electro-optic module 16 (FIG. 1) or the like. These injection-molded card guides 12 can be separately formed, or they can be integrally formed with an adjoining bottom or top piece (not illustrated), for example. Likewise, as opposed to being injection-molded, the card guides 12 can be formed by any other suitable manufacturing technology, involving plastics, metals, etc.

Preferably, each of the card guides 12 includes one or more tooling pins 18 (FIG. 2) disposed on its bottom surface and configured to selectively engage a corresponding hole 20 (FIG. 2) manufactured or drilled into the board 14 of the optical communications component, thereby precisely aligning each of the card guides 12 on the surface of the board 14 of the optical communications component.

Finally, each of the card guides 12 includes one or more solderable mounting tabs 22 disposed along its length, on one or both sides. These solderable mounting tabs 22 are selectively soldered to the surface of the board 14 of the optical communications component once the associated card guides 12 are properly positioned. Other componentry associated with the optical communications component and the electro-optic module 16 is not described herein, as such componentry is well known to those of ordinary skill in the art.

Advantageously, once the solderable mounting tabs 22 are selectively soldered to the surface of the board 14 of the optical communications component, the card guides 12 are permanently and precisely mounted to the surface of the board 14 of the optical communications component without the use of or need for conventional thru-hole mounting hardware, and without impacting or blocking routing channels inside the board 14 of the optical communications component. By design, the height of the card guides 12 is selected to ensure the proper vertical alignment of the electro-optic module 16 with respect to the associated connector system 24.

Each connector system 24 is a standard connector system. Thus, a precise X-Y-Z alignment and connectivity of the electro-optic module 16 results.

Figure 3:
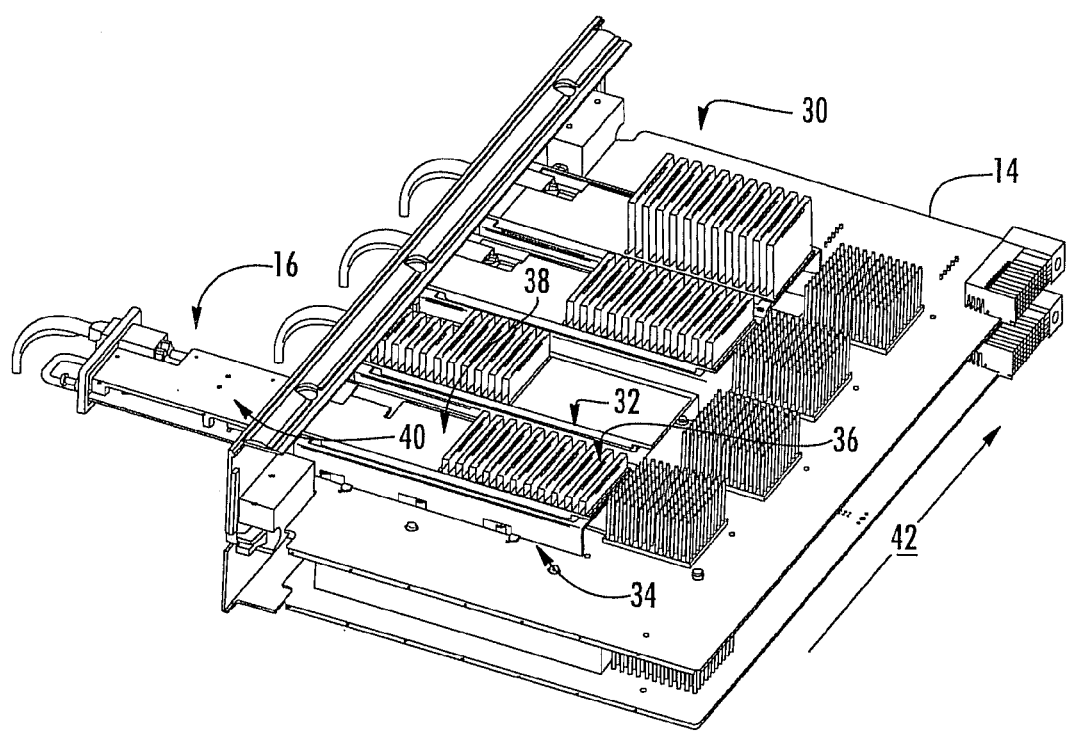
FIG. 3 is a perspective view of one exemplary embodiment of the staggered heatsink assembly of the present invention.
Figure 4:
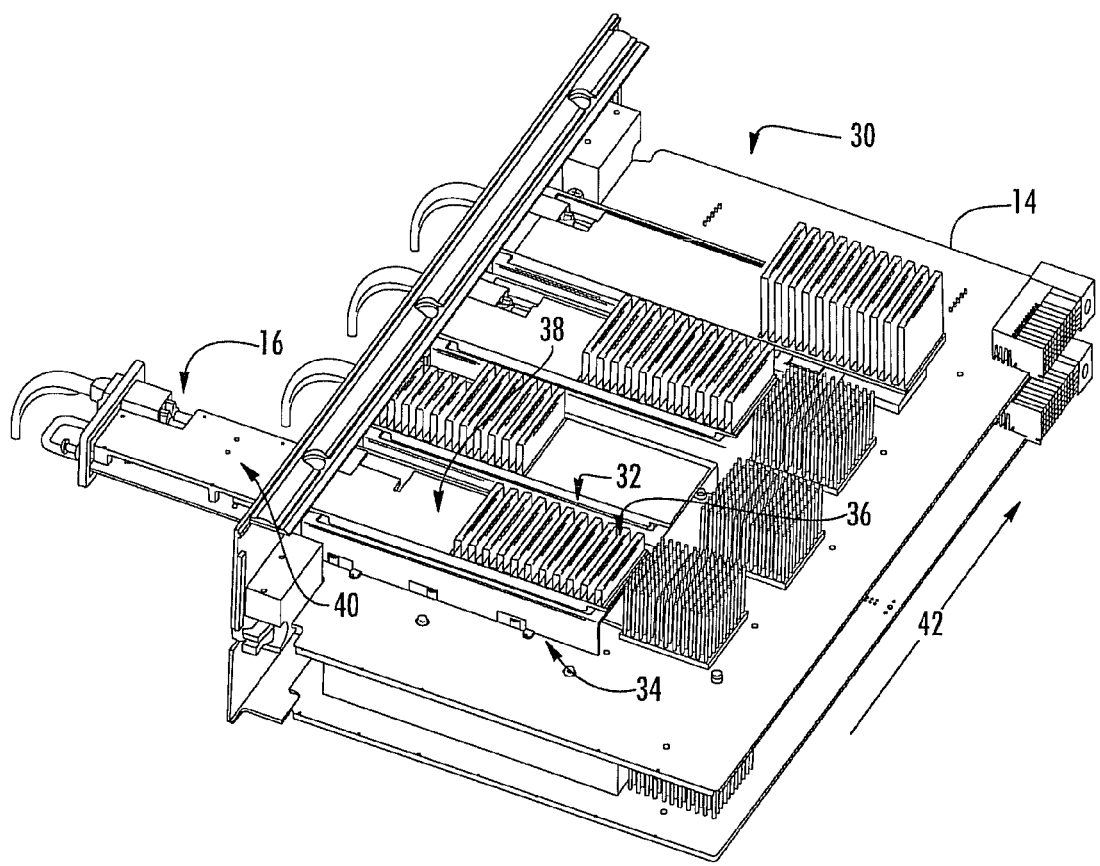
FIG. 4 is another perspective view of the staggered heatsink assembly of FIG. 3, highlighting a configuration utilizing front-to-back heatsink staggering from the faceplate to the rear of each of the circuit packs and staggered-height radiative fin structures.
Figure 5:
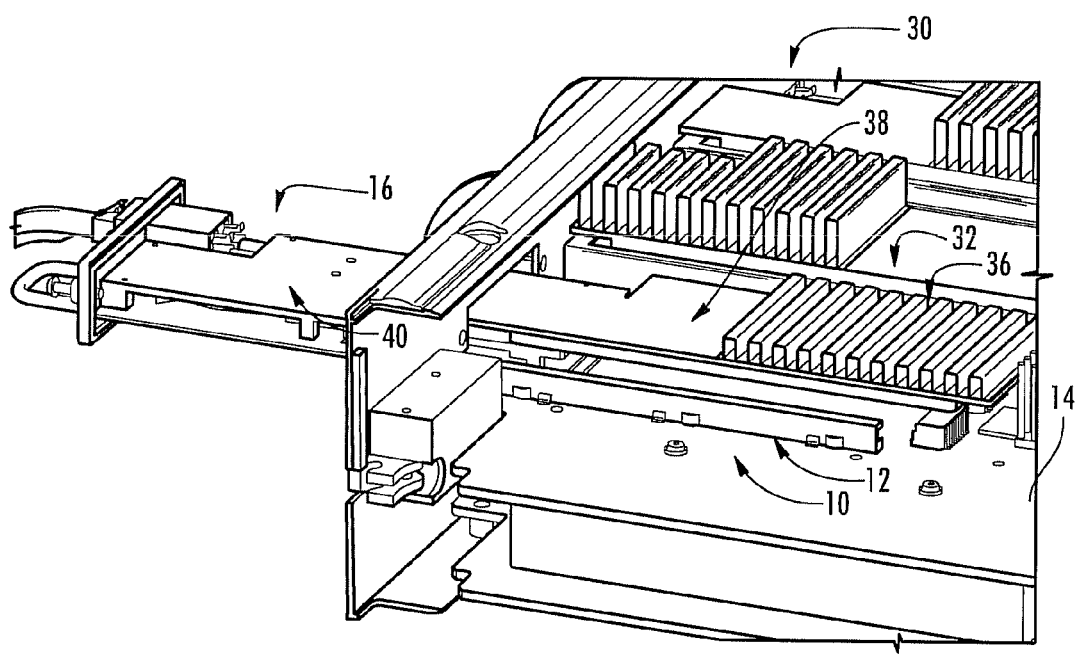
FIG. 5 is an exploded partial perspective view of the staggered heatsink assembly of FIGS. 3 and 4, highlighting the configuration of the associated sliding thermal interface between the staggered heatsink assembly and the heat spreader coupled to each of the circuit packs.

Referring to FIGS. 3-5, the staggered heatsink assembly 30 of the present invention includes a plurality of heatsink devices 32 mounted to a plurality of heatsink device mounting brackets 34 (FIGS. 3 and 4), which are in turn mounted to the board 14 of the optical communications component. The plurality of heatsink devices 32 are mounted to the plurality of heatsink device mounting brackets 34 via a plurality of spring-loaded clips, spring-loaded hold-downs, or the like, well known to those of ordinary skill in the art. This spring-loading ensures that each of the plurality of heatsink devices 32 maintains a constant load against and thermal communication with the associated electro-optic module 16 and an attached heat spreader 40. The plurality of heatsink devices 32 each include a heatsink plate 36 in thermal communication with a radiative fin structure 38. Thus, when an electro-optic module 16 is inserted into its slot, as described above, heat is effectively transferred from the electro-optic module 16, to the attached heat spreader 40, across the sliding thermal interface between the heat spreader 40 and the heatsink plate 36 of the associated heatsink device 32, to the radiative fin structure 38 of the heatsink device 32, and into the air flowing across the surface of the staggered heatsink assembly 30, thereby effectively cooling the electro-optic module 16.

Referring specifically to FIG. 3, in one exemplary embodiment, four heatsink devices 32 are illustrated, the associated radiative fin structures 38 having progressively increasing heights from the bottom of the figure to the top of the figure, and the second heatsink device 32 from the bottom of the figure being staggered from the other heatsink devices 32. Thus, the first heatsink 32 device from the bottom of the figure has the shortest fins meeting the cooling requirements of the first electro-optic module 16 from the bottom of the figure, the second heatsink device 32 from the bottom of the figure has slightly taller fins and an associated placement meeting the cooling requirements of the second electro-optic module 16 from the bottom of the figure, and so on. It should be noted that the air flow direction 42 is from the bottom of the figure to the top of the figure, thus it makes sense to utilize progressively taller fins from upstream to downstream.

Referring specifically to FIG. 4, in another exemplary embodiment, four heatsink devices 32 are again illustrated, the associated radiative fin structures 38 having progressively increasing heights from the bottom of the figure to the top of the figure, the second heatsink device 32 from the bottom of the figure being staggered from the other heatsink devices 32, and the fourth heatsink device 32 from the bottom of the figure being staggered from the other heatsink devices 32. Thus, the first heatsink 32 device from the bottom of the figure has the shortest fins meeting the cooling requirements of the first electro-optic module 16 from the bottom of the figure, the second heatsink device 32 from the bottom of the figure has slightly taller fins and an associated placement meeting the cooling requirements of the second electro-optic module 16 from the bottom of the figure, and so on.

FIG. 5 illustrates the interplay of the various components of the staggered heatsink assembly 30 and, specifically, how heat is effectively transferred from the electro-optic module 16, to the attached heat spreader 40, across the sliding thermal interface between the heat spreader 40 and the heatsink plate 36 of the associated heatsink device 32, to the radiative fin structure 38 of the heatsink device 32, and into the air flowing across the surface of the staggered heatsink assembly 30, thereby effectively cooling the electro-optic module 16. It should be noted that, in FIG. 5, the heatsink device mounting brackets 34 (FIGS. 3 and 4) are removed for clarity and a card guide 12 associated with the solderable surface-mounted card guide assembly 10 of the present invention is visible, highlighting the potential interplay of the various assemblies described herein.

Advantageously, the staggered heatsink assembly 30 of the present invention enables more pluggable electro-optic modules 16 to be packed in a given circuit pack without having to increase the associated airflow in the electronic shelf. This enables the greatest possible amount of optical transmitting/receiving capability to be packed in the smallest possible volume.

The solderable surface-mounted card guide assembly 10 (FIGS. 1 and 2) of the present invention finds particular applicability with small-form factor pluggable electro-optic modules not utilizing any type of module cage, while the staggered heatsink assembly 30 (FIGS. 3-5) of the present invention finds particular applicability with small-form factor pluggable electro-optic modules both not utilizing and utilizing any type of module cage. For example, the staggered heatsink assembly 30 may be integrated with cage-less small-form factor pluggable electro-optic modules, as described above for cage-mounted small-form factor pluggable electro-optic modules. In other words, what the staggered heatsink assembly 30 is actually integrated with may be varied on an application-specific basis.

Although the present invention has been illustrated and described herein with reference to preferred embodiments and specific examples thereof, it will be readily apparent to those of ordinary skill in the art that other embodiments and/or examples can perform similar functions and/or achieve like results. All such equivalent embodiments and/or examples are within the spirit and scope of the present invention, are contemplated thereby, and are intended to be covered by the following claims.

What is claimed is:

1. A staggered heatsink assembly configured to control the temperature of a pluggable electro-optic module disposed in an optical communications component, the staggered heatsink assembly comprising:
a plurality of card guides, wherein each of the plurality of card guides comprises an internally-slotted rail that is configured to slidingly receive a guide manufactured into a side of the pluggable electro-optic module, wherein each of the internal slots is substantially coextensive with the corresponding rail along its length;
one or more heatsink devices, each of the one or more heatsink devices comprising:
one or more heatsink device mounting brackets;
a heatsink plate coupled to the one or more heatsink device mounting brackets, wherein the heatsink plate is in thermal communication with an associated pluggable electro-optic module disposed in the optical communications component; and
a radiative fin structure coupled to the heatsink plate opposite the associated pluggable electro-optic module disposed in the optical communications component, wherein the radiative fin structure is in thermal communication with the heatsink plate and is exposed to an air flow; and
a heat spreader coupled to the associated pluggable electro-optic module, wherein the heat spreader is in thermal communication with both the heatsink plate of a given heatsink device and the associated pluggable electro-optic module via a spring-loaded interface that biases the heatsink plate against the heat spreader.

2. The staggered heatsink assembly of claim 1, wherein the heat spreader is in thermal communication with both the heatsink plate of the given heatsink device and the associated pluggable electro-optic module via a sliding interface.

3. The staggered heatsink assembly of claim 1, wherein at least two of the one or more heatsink devices comprise a radiative fin structure of a different height.

4. The staggered heatsink assembly of claim 1, wherein at least two of the one or more heatsink devices comprise a radiative fin structure that is disposed in a different location relative to a front plate of the optical communications component.

5. The staggered heatsink assembly of claim 1, wherein the optical communications component comprises a circuit pack.

6. A method for controlling the temperature of a pluggable electro-optic module disposed in an optical communications component, the method comprising:
   providing a plurality of card guides, wherein each of the plurality of card guides comprises an internally-slotted rail that is configured to slidingly receive a guide manufactured into a side of the pluggable electro-optic module, wherein each of the internal slots is substantially coextensive with the corresponding rail along its length;
   providing one or more heatsink devices, providing each of the one or more heatsink devices comprising:
      providing one or more heatsink device mounting brackets;
      providing a heatsink plate coupled to the one or more heatsink device mounting brackets, wherein the heatsink plate is in thermal communication with an associated pluggable electro-optic module disposed in the optical communications component; and
      providing a radiative fin structure coupled to the heatsink plate opposite the associated pluggable electro-optic module disposed in the optical communications component, wherein the radiative fin structure is in thermal communication with the heatsink plate and is exposed to an air flow; and
   providing a heat spreader coupled to the associated pluggable electro-optic module, wherein the heat spreader is in thermal communication with both the heatsink plate of a given heatsink device and the associated pluggable electro-optic module via a spring-loaded interface that biases the heatsink plate against the heat spreader.

7. The method of claim 6, wherein the heat spreader is in thermal communication with both the heatsink plate of the given heatsink device and the associated pluggable electro-optic module via a sliding interface.

8. The method of claim 6, wherein at least two of the one or more heatsink devices comprise a radiative fin structure of a different height.

9. The method of claim 6, wherein at least two of the one or more heatsink devices comprise a radiative fin structure that is disposed in a different location relative to a front plate of the optical communications component.

10. The method of claim 6, wherein the optical communications component comprises a circuit pack.

11. An optical communications component, comprising:
   a board;
   a plurality of card guides disposed on the board, wherein each of the plurality of card guides comprises an internally-slotted rail that is configured to slidingly receive a guide manufactured into a side of a module, wherein each of the internal slots is substantially coextensive with the corresponding rail along its length;
   one or more heatsink devices disposed on the board, each of the one or more heatsink devices comprising:
      one or more heatsink device mounting brackets;
      a heatsink plate coupled to the one or more heatsink device mounting brackets, wherein the heatsink plate is in thermal communication with an associated module; and
      a radiative fin structure coupled to the heatsink plate opposite the associated module, wherein the radiative fin structure is in thermal communication with the heatsink plate and is exposed to an air flow; and
   a heat spreader coupled to the associated module, wherein the heat spreader is in thermal communication with both the heatsink plate of a given heatsink device and the associated module via a sliding spring-loaded interface that biases the heatsink plate against the heat spreader.

* * * * *